United States Patent
Tsironis

(10) Patent No.: US 9,960,472 B1
(45) Date of Patent: May 1, 2018

(54) PROGRAMMABLE AMPLITUDE AND PHASE CONTROLLER

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 0 days. days.

(21) Appl. No.: 15/608,238

(22) Filed: May 30, 2017

Related U.S. Application Data

(60) Provisional application No. 62/343,043, filed on May 30, 2016.

(51) Int. Cl.
*H01P 1/18* (2006.01)
*H01P 1/22* (2006.01)
*H01P 5/04* (2006.01)
*H01P 1/23* (2006.01)
*G01R 31/26* (2014.01)

(52) U.S. Cl.
CPC ............ *H01P 5/04* (2013.01); *G01R 31/2601* (2013.01); *H01P 1/181* (2013.01); *H01P 1/182* (2013.01); *H01P 1/222* (2013.01); *H01P 1/23* (2013.01)

(58) Field of Classification Search
CPC . H01P 5/04; H01P 1/182; H01P 1/222; G01R 31/00
USPC ..... 333/109, 110, 111, 81 R, 263, 17.3, 159; 324/637, 641, 537
See application file for complete search history.

(56) References Cited

U.S. PATENT DOCUMENTS

| | | |
|---|---|---|
| 7,282,926 B1 | 6/2007 | Verspecht et al. |
| 9,252,471 B1 | 2/2016 | Tsironis |
| 2002/0000894 A1* | 1/2002 | Yamada ............... H01P 5/18 333/111 |
| 2016/0079648 A1* | 3/2016 | Wang .................. H01P 5/085 333/24 R |

OTHER PUBLICATIONS

"Load pull characterization system for differential devices", [online], Conference 2003, Fall 2003, 62nd ARFTG IEEE Microwave Measurement [Retrieved on May 18, 2017]. Retrieved from Internet <URL: http://ieeexplore.ieee.org/document/1459774/>.
Dual Directional Couplers, Model IPP-3515 Datasheet, [online], Innovative Power Products, [Retrieved on May 18, 2017]. Retrieved from Internet <URL: http://innovativepp.com/product/ipp-3151/>.
"Multiport & Balanced Device Measurement Application Note Series" Application Note 1373-2, [online], Keysight Technologies, [Retrieved on May 30, 2017]. Retrieved from Internet <URL: http://www.keysight.com/main/facet.jspx?&cc=CA&lc=eng&k= application+note+1373-2&pSearch=tnmSearch &hasLuckySearch=true>.

(Continued)

*Primary Examiner* — Stephen E Jones

(57) ABSTRACT

A continuously manually or remotely adjustable microwave attenuator and linear phase shifter uses a mobile signal coupler (wave-probe) and a slabline structure terminated with 50 Ohms. The coupled port of the wave-probe is connected with the output port of the unit using flexible RF cable. The wave-probe is attached to the vertical axis of a mobile carriage, which is moved at variable distance from the input port, corresponding to the expected transmission phase, whereas the depth, at which the wave-probe is inserted into the slabline, determines the coupling factor and thus the value of the attenuation. Amplifier and low pass filters compensate for coupling loss and equalize for frequency slope.

12 Claims, 14 Drawing Sheets

(56) References Cited

OTHER PUBLICATIONS

Balun, [online], Wikipedia, [Retrieved on May 17, 2017]. Retrieved from Internet <URL: http://en.wikipedia.org/wiki/Balun>.
Variable Attenuators, [online], Microwaves 101, [Retrieved on May 17, 2017]. Retrieved from Internet <URL: http://www.microwaves101.com/encyclopedia/attenuatorvariable.cfm>.
Phase shifters, [online], Microwaves 101, [Retrieved on May 17, 2017]. Retrieved from Internet <URL: http://www.microwaves101.com/encyclopedia/phaseshifters.cfm>.
Waveguide Variable Attenuator, product catalog p. 14, [online], Elmika [Retrieved on May 30, 2017]. Retrieved from Internet <URL: http://www.elmika.com/catalogs.html>.
Manual Step Attenuator, [online], Keysight Technologies [Retrieved on May 30, 2017]. Retrieved from Internet <URL: http://www.keysight.com/en/pd-1000001981%3Aepsg%3Apro-pn-8496A/manual-attenuator-4-ghz-110-db-10-db-steps?nid=-32728.536879121&cc=CA&lc=eng>.
"Computer Controlled Microwave Tuner, CCMT", Product Note 41, Focus Microwaves Inc. 1998, pp. 2-4.
Line Stretchers, SR series, Datasheet, [online] Microlab, [Retrieved on May 19, 2017]. Retrieved from Internet <URL: fxr.com/~/media/Microlab/Datasheets/SRseries 0113 RA.ashx>.

\* cited by examiner

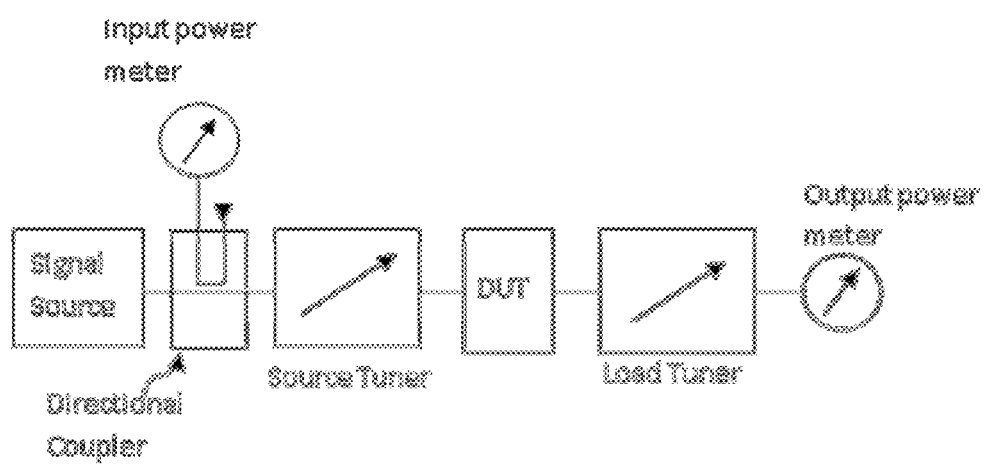
FIG. 1: Prior art

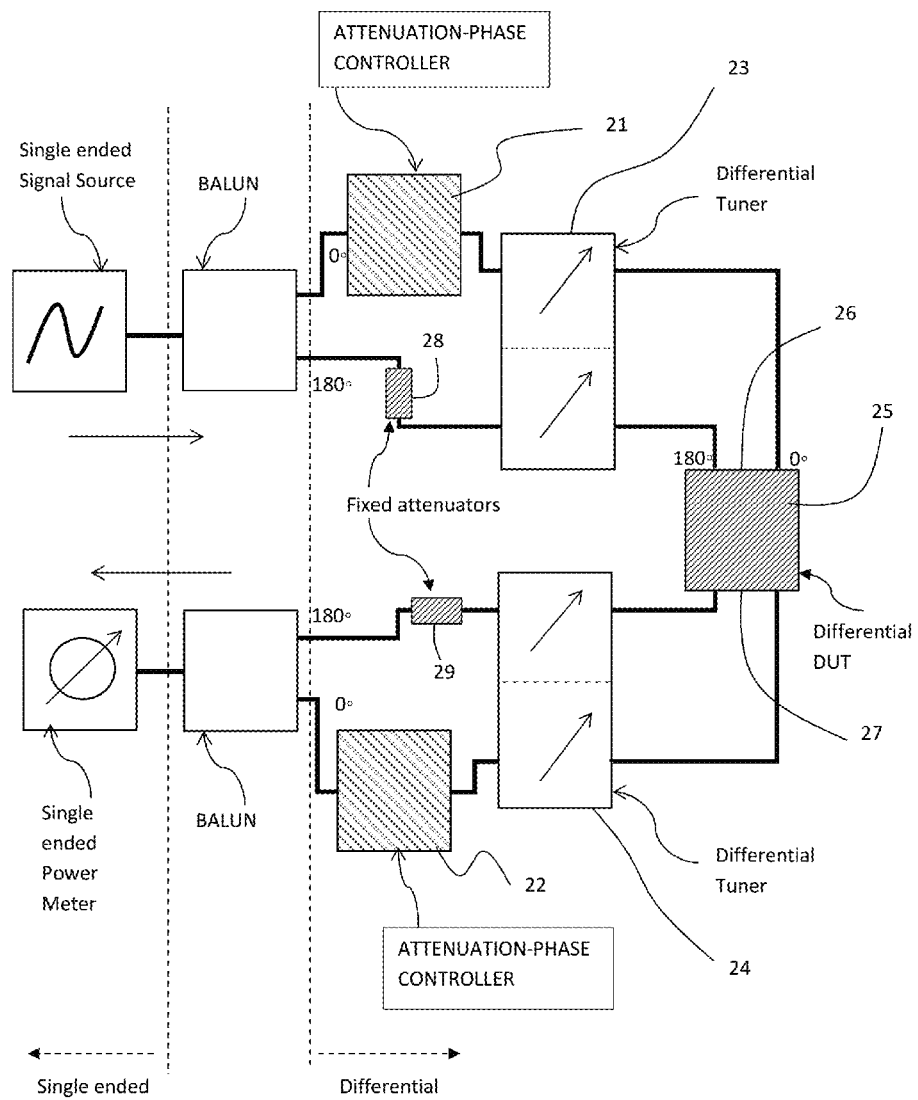
FIG. 2: Prior art

FIG. 3A: Prior art
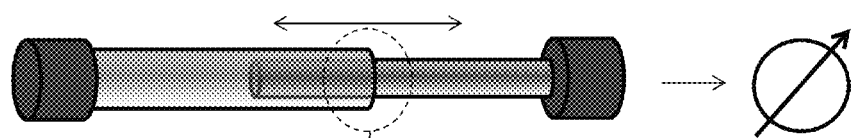
FIG. 3B: Prior art
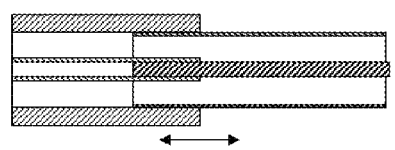
FIG. 3C: Prior art
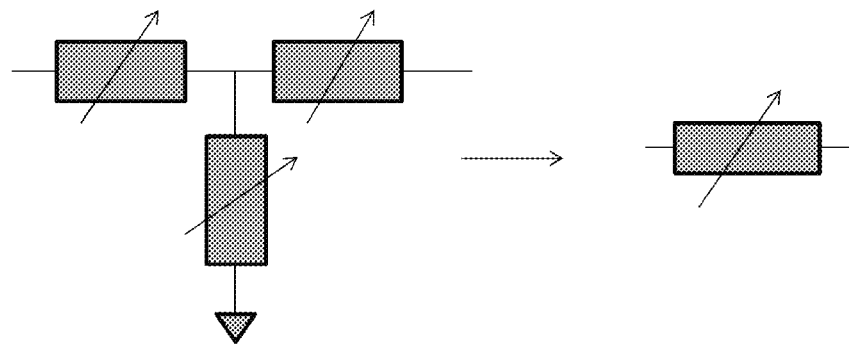
FIG. 3D: Prior art
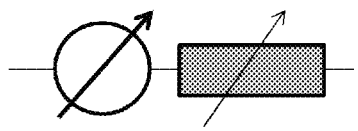

FIG. 4A: Prior art
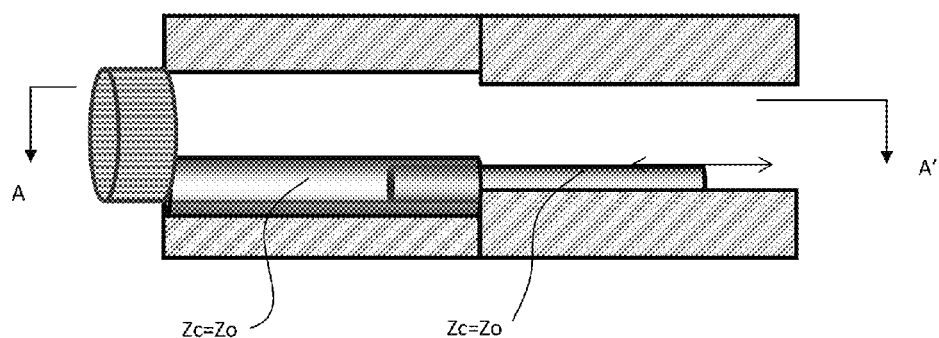
FIG. 4B: Prior art
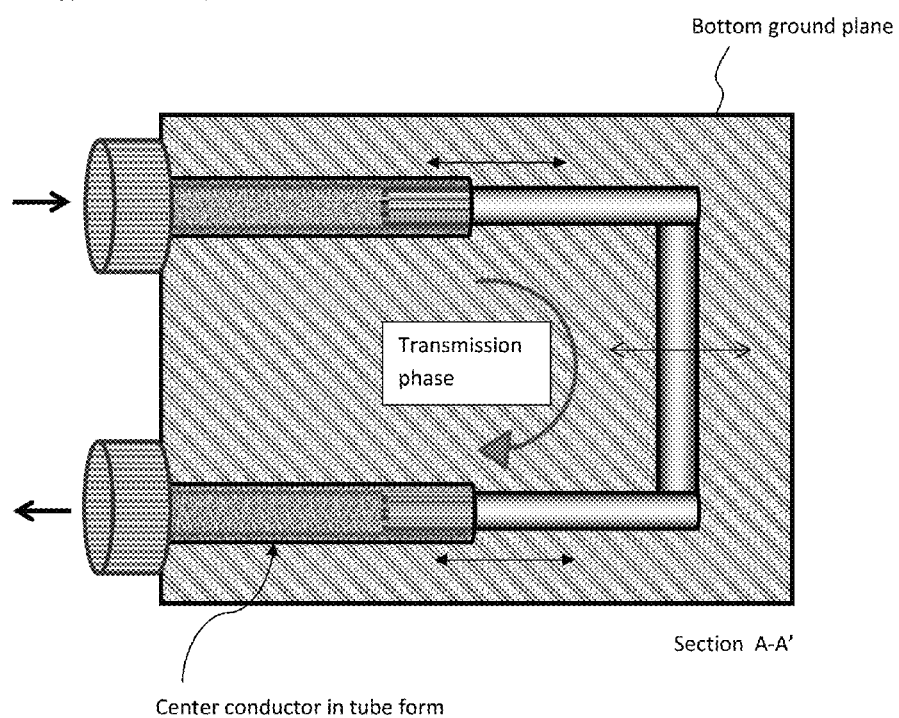

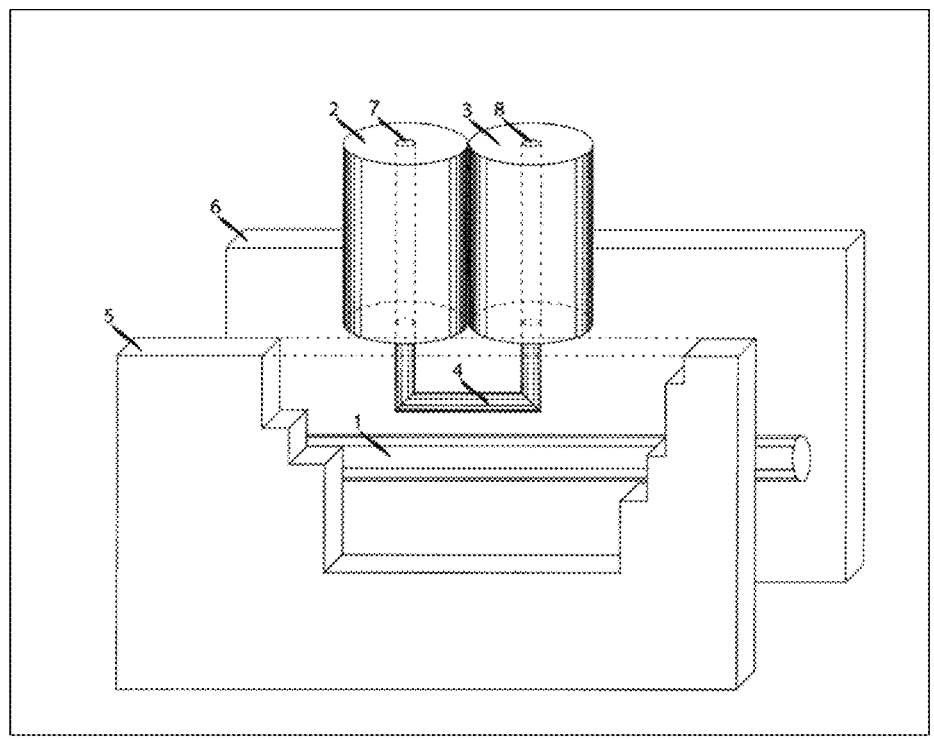
FIG. 5: Prior art

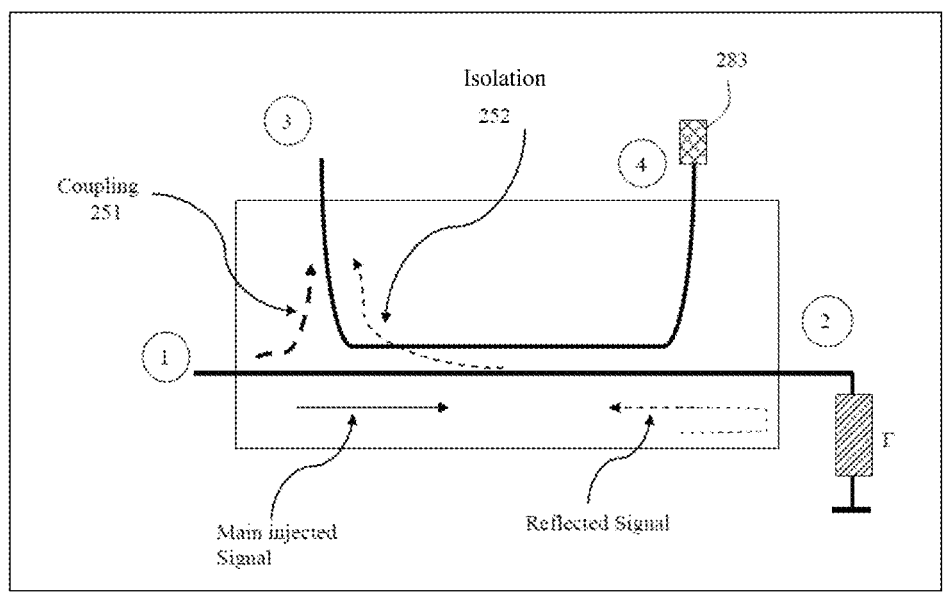
FIG. 6: Prior art

PROGRAMMABLE AMPLITUDE AND PHASE CONTROLLER

PRIORITY CLAIM

This application claims priority on Provisional Application 62/343,043, filed on 30 May 2016 and titled "Programmable Amplitude and Phase Controller".

CROSS-REFERENCE TO RELATED ARTICLES

1. "Load pull characterization system for differential devices", [online], Conference 2003, Fall 2003, 62$^{nd}$ ARFTG IEEE Microwave Measurement [Retrieved on 2017 May 18]. Retrieved from Internet <URL: http://ieeexplore.ieee.org/document/1459774>
2. Dual Directional Couplers, Model IPP-3515 Datasheet, [online], Innovative Power Products, [Retrieved on 2017 May 18]. Retrieved from Internet <URL: http://innovativepp.com/product/ipp-3151/>
3. "Multiport & Balanced Device Measurement Application Note Series" Application Note 1373-2, [online], Keysight Technologies, [Retrieved on 2017 May 30]. Retrieved from Internet <URL: http://www.keysight.com/main/facet.jspx?&cc=CA&lc=eng&k=application+note+1373-2&pSearch=tnmSearch&hasLuckySearch=true>
4. Balun, [online], Wikipedia, [Retrieved on 2017 May 17]. Retrieved from Internet <URL: http://en.wikipedia.org/wiki/Balun>
5. Variable Attenuators, [online], Microwaves 101, [Retrieved on 2017 May 17]. Retrieved from Internet <URL: http://www.microwaves101.com/encyclopedia/attenuator variable.cfm>
6. Phase shifters, [online], Microwaves 101, [Retrieved on 2017 May 17]. Retrieved from Internet <URL: http://www.microwaves101.com/encyclopedia/phaseshifters.cfm>
7. Waveguide Variable Attenuator, product catalog page 14, [online], Elmika [Retrieved on 2017 May 30]. Retrieved from Internet <URL: http://www.elmika.com/catalogs.html>
8. Manual Step Attenuator, [online], Keysight Technologies [Retrieved on 2017 May 30]. Retrieved from Internet <URL: http://www.keysight.com/en/pd-1000001981%3Aepsg%3Apro-pn-8496A/manual-attenuator-4-ghz-110-db-10-db-steps?nid=-32728.536879121&cc=CA&lc=eng>
9. "Computer Controlled Microwave Tuner, CCMT", Product Note 41, Focus Microwaves Inc. 1998, pages 2-4.
10. Tsironis, U.S. Pat. No. 9,252,471, "Wideband attenuation and phase controller".
11. Verspecht et al. U.S. Pat. No. 7,282,926, "Method and an apparatus for characterizing a high-frequency device-under-test in a large signal impedance tuning environment".
12. Line Stretchers, SR series, Datasheet, [online] Microlab, [Retrieved on 2017 May 19]. Retrieved from Internet <URL: fxr.com/~/media/Microlab/Datasheets/SRseries 0113 RA.ashx>

BACKGROUND OF THE INVENTION

This invention relates to general microwave testing and in particular to testing of differential microwave transistors (DUT) in the frequency and time domain using Load Pull (see ref. 1). Load pull is the method by which the load impedance presented to the DUT at a given frequency is changed systematically and the DUT performance is registered, with the objective to find an optimum depending on the overall design objectives. This may be maximum power, efficiency, linearity or else.

Each port on a connectorized RF device comprises two terminals. When one terminal connection is used to transmit the RF signal and the other is used as a ground reference, the port is referred to as "single-ended". Traditionally, most RF devices have been designed to operate in this mode. When a terminal is designed to reference a signal on another terminal (and not the ground terminal), it is operating in a "differential" mode (see ref. 3). The terminal pair is known as a differential or "balanced" port. These circuits are designed to have a pair of electrically symmetrical signal paths. Signals are transmitted through the device 180 degrees out-of-phase with respect to one another. Any signal that is "common" or in-phase to both terminals will ideally be rejected, and will not pass through the circuit. This characteristic gives the device a lower sensitivity to electromagnetic interference (EMI).

A differential load pull setup is shown in FIG. 2. A single ended signal source injects power into a BALUN (see ref. 4). A BALUN (Balanced-Unbalanced) is a component which generates a differential signal from a single ended one or the opposite. It has three terminals; the input terminal relative to a common (ground) terminal creates a single ended input/output port and two terminals create the differential output/input port. BALUNs can be used in both directions. The accuracy of the measurement depends on the precision with which the phase opposition and the amplitude equality of the signals at the differential port. Ideally the two signals must have the same amplitude and a phase difference of 180°. In reality this is never the case. Therefore an efficient test system shall provide for continuous and fine adjustment of the differential signal components, both in amplitude and phase, both before and after the DUT. In FIG. 2 this is done using the Variable Attenuation and Phase Shifter controllers (VAPS, 21, 22). The differential tuners (23, 24) create true differential impedance presented to the differential DUT (25) at both its input (26) and output (27) terminals. Since the VAPS has a minimum attenuation this must be compensated by fixed attenuators (28, 29). For this and a number of other test applications this invention discloses automated and programmable wideband attenuation and phase controllers.

PRIOR ART

Variable attenuators (see ref. 5) and phase shifters, FIGS. 3 and 4, (see ref. 6) have been known for a long time. Finely adjustable variable attenuators are known in waveguide transmission structures (see ref. 7); in coaxial microwave structures only step attenuators are known (see ref. 8). Waveguide transmission lines are impractical for frequencies below 3 GHz, because of their large size (a WR 340 waveguide for frequencies between 2.2 GHz and 3.3 GHz, is a rectangular tube 3.56" wide and 1.86" high) and limited frequency bandwidth. Linear, finely adjustable phase shifters (line stretchers) are also known, see ref. 12. The structure proposed in ref. 10 uses absorbing material in line with the line stretcher for attenuation control; this creates unnecessary reflections. The structure proposed here uses couplers which, by nature, have better reflection and higher frequency bandwidth behavior.

BRIEF SUMMARY OF THE INVENTION

The amplitude (attenuation)/phase controller (APC), FIG. 7, uses, as transmission media, a section of slabline (75), a compact wideband mobile signal coupler (703) and a section of flexible coaxial RF cable (79) leading to the output port (78); the total is assembled using a mobile carriage (905), sliding inside a matched (76, 901) slabline, and the same basic technology as slide screw impedance tuners (see ref. 9). However, instead of reflective tuning probes (slugs) the vertical axis (702) holds a wave probe ((703), see FIGS. 5 and 6 and ref. 11) of which the isolated port is matched (283, 701) and the coupled port is connected to the output port (78). The vertical axis can insert (702) the wave-probe to various depths into the slabline and control this way the coupling factor (72) between the coupler (703) and the center conductor (74) and thus the amount of energy flowing from the input port (70) into the wave-probe (703) and from there to the output port (78), which is connected with the wave-probe using a flexible RF cable (79). The carriage (905) can move the wave-probe along the slabline (73, 95) thus changing the electrical distance (71) and transmission phase Φ(X) between the wave-probe and the input port. This controls the transmission phase Φ21 between the input (70) and output (78) ports. The idle port (77) is terminated with characteristic impedance (76). By consequence a simple X-Y (horizontal (73) and vertical (Y)) movement control of the carriage (905) and the vertical axis (Y) is translated into an attenuation/phase control of a wideband signal transmission.

DETAILED DESCRIPTION OF THE DRAWINGS

The invention will be better understood in view of the included drawings of which FIG. 1 depicts prior art, a typical load pull test system.

FIG. 2 depicts prior art, a typical differential load pull test system.

FIG. 3A through 3D depict prior art, FIG. 3A depicts structural and schematic diagram of linear phase shifter; FIG. 3B depicts cross section of linear phase shifter; FIG. 3C depicts symbolic attenuator, and FIG. 3D depicts symbolic combination of attenuator and phase shifter.

FIGS. 4A through 4B depict prior art, the structural detail of the coaxial and slabline transition in a linear phase shifter. FIG. 4A depicts a cross section and FIG. 4B depicts a top view of the phase shifter with fixed position of input and output ports.

FIG. 5 depicts prior art, the perspective 3D view of a cut through a "wave-probe" type signal coupler.

FIG. 6 depicts prior art, coupling and isolation definitions in a bidirectional signal coupler four-port; coupling is defined between ports 1 and 3 and isolation between ports 2 and 3; leakage from port 2 to port 3, through isolation, occurs only if the load Γ≠0 ($Z_{load}$≠50Ω).

Figure 7:
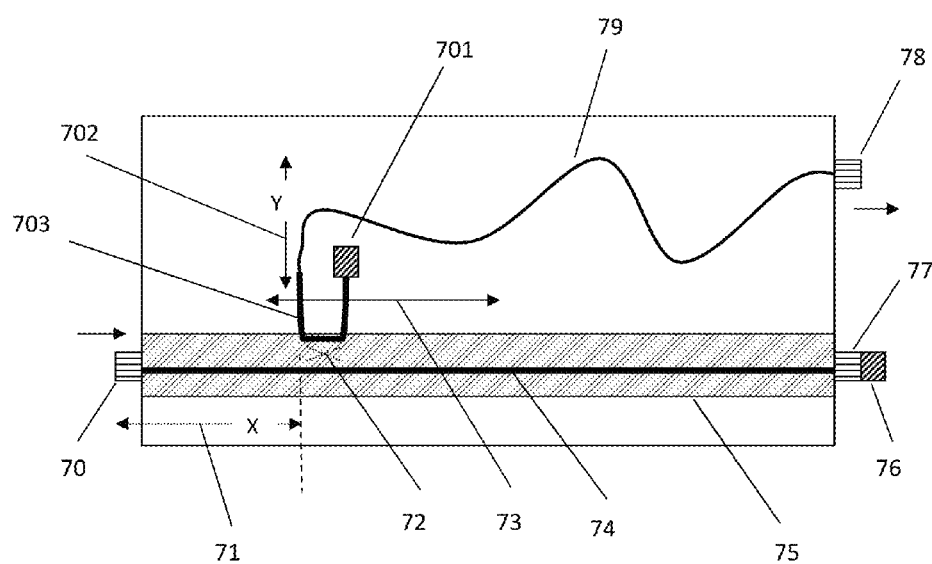

FIG. 7 depicts the basic structure of the adjustable attenuation and phase shifter (APC).

Figure 8:
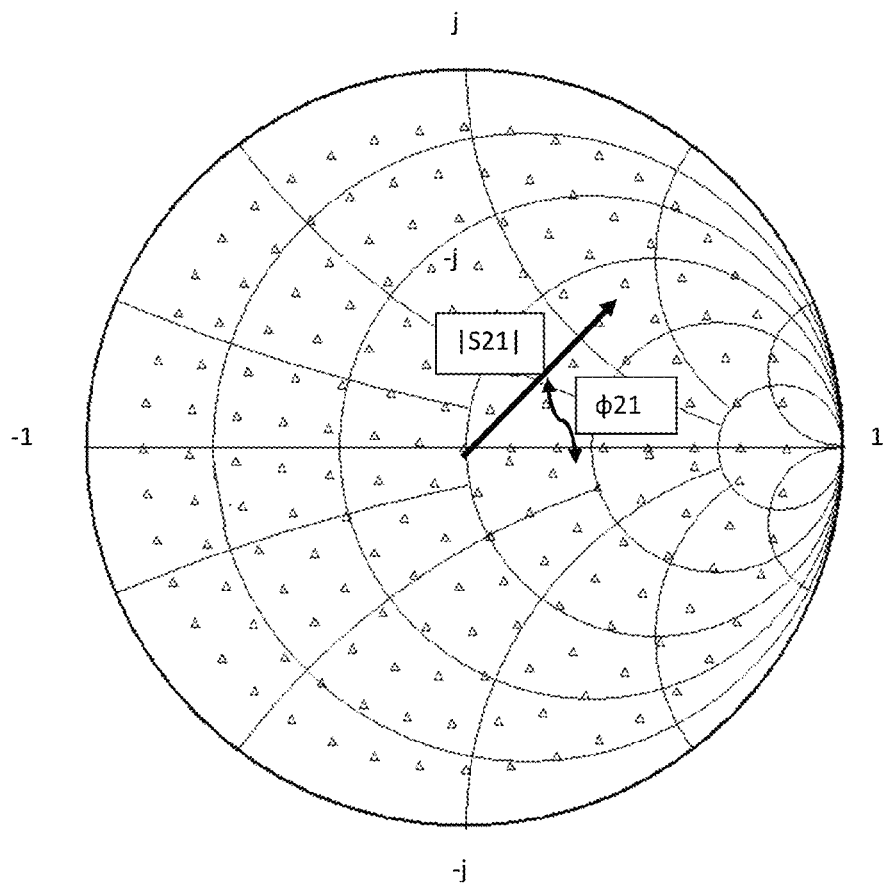
Figure 13:
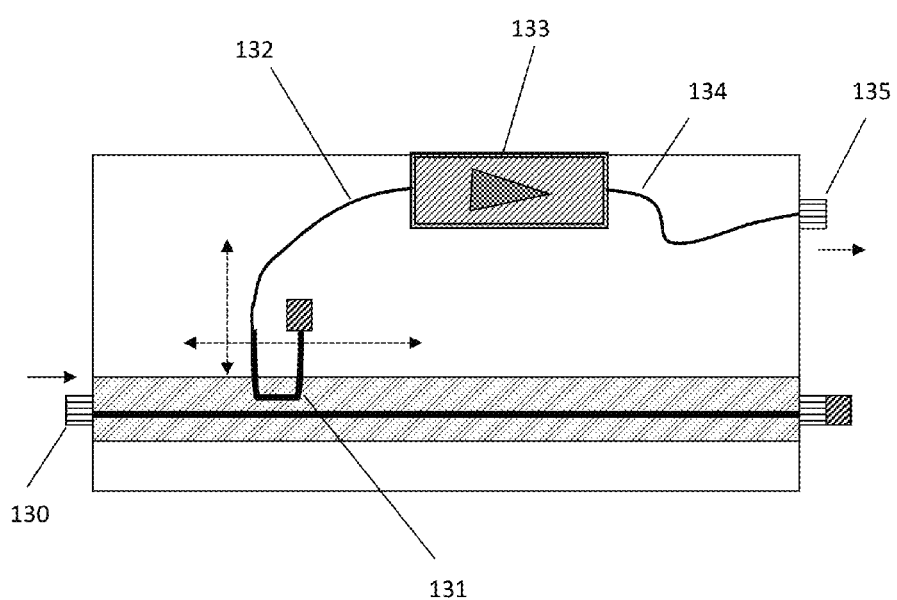

FIG. 8 depicts measured transmission factor vectors of the APC of FIG. 13, as a function of coupling factor and horizontal movement (phase).

Figure 9:
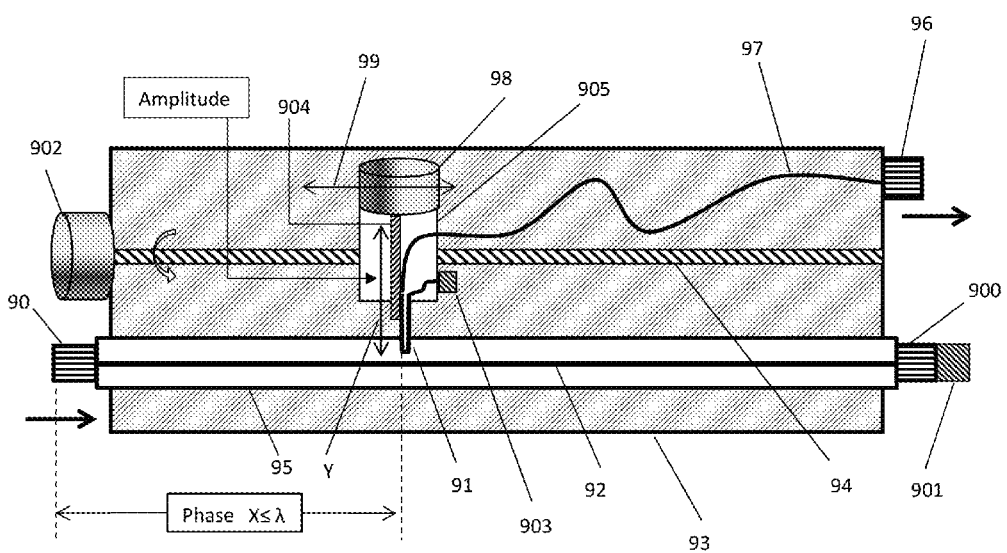

FIG. 9 depicts detailed structure of automated attenuation and phase controller (APC), without amplifier compensation.

Figure 10:
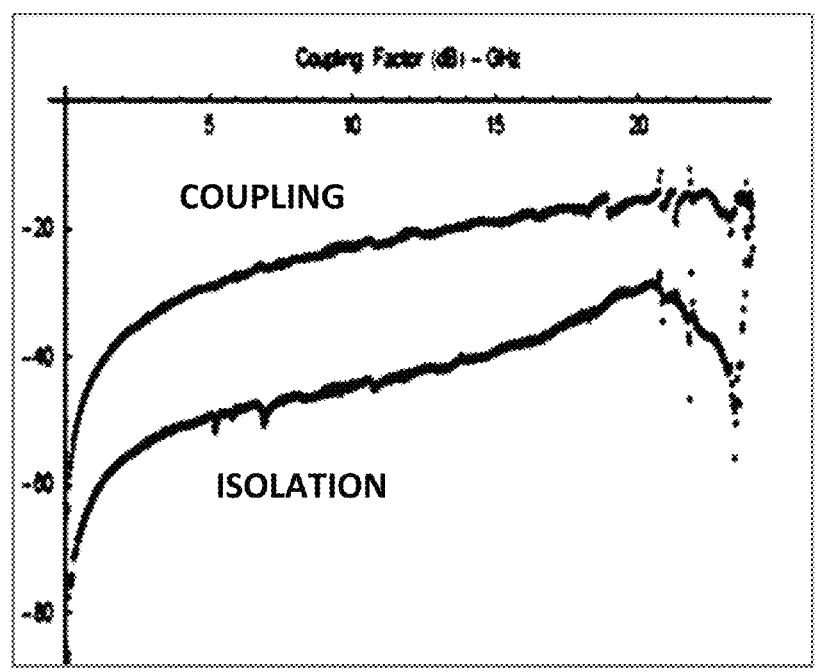

FIG. 10 depicts measured wideband response of coupling and isolation of wave-probe used in APC.

Figure 11:
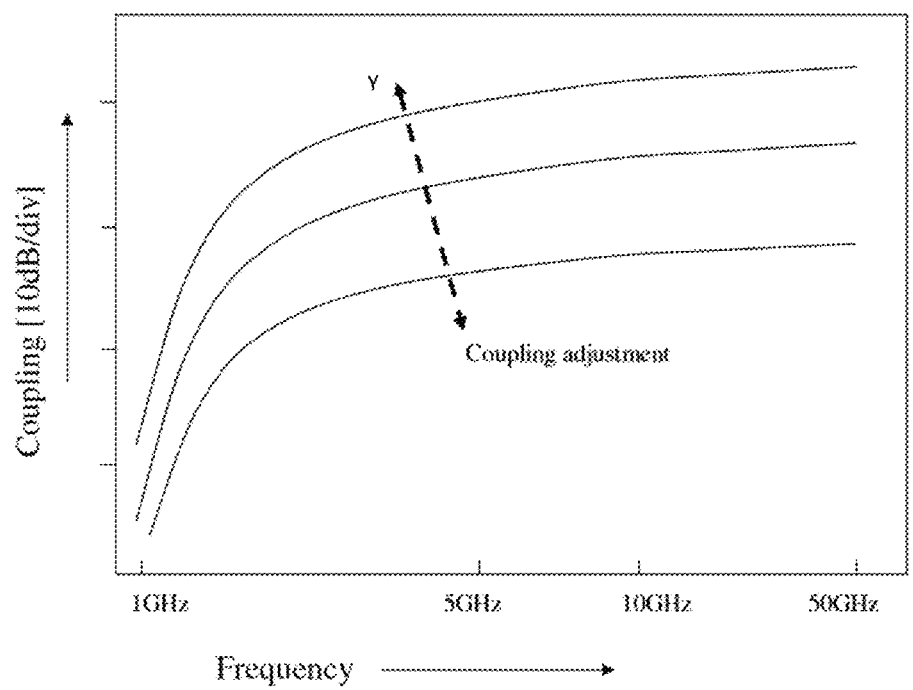

FIG. 11 depicts coupling control of wave-probe via depth control of the probe into the slabline.

Figure 12:
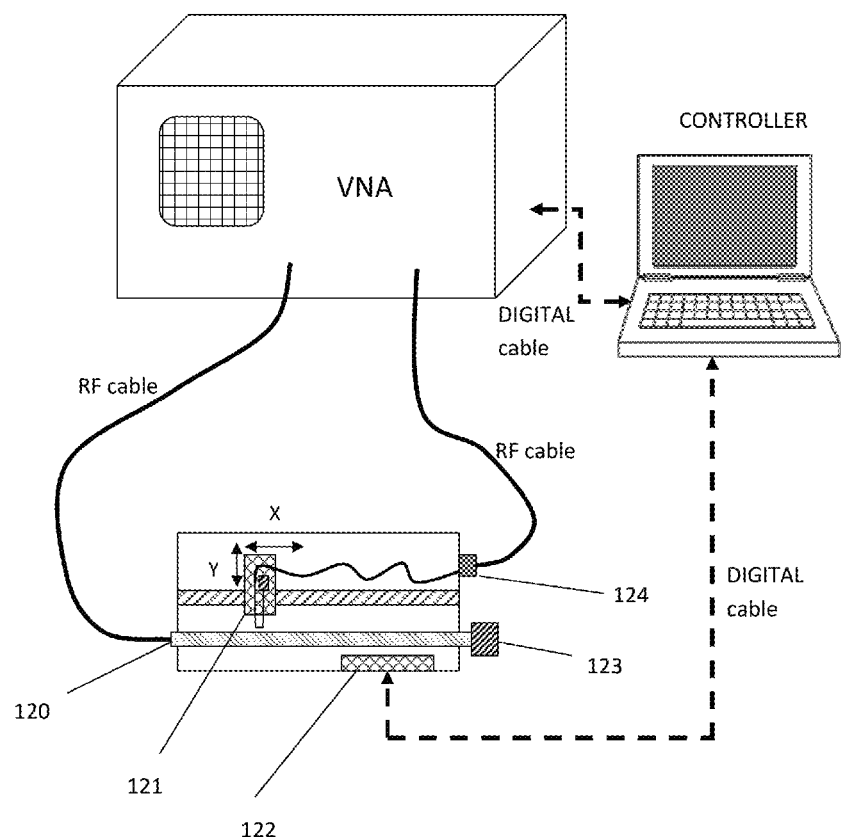

FIG. 12 depicts calibration test setup for APC using PC controller and vector network analyzer (VNA).

FIG. 13 depicts APC with coupling loss compensating amplifier.

Figure 14:
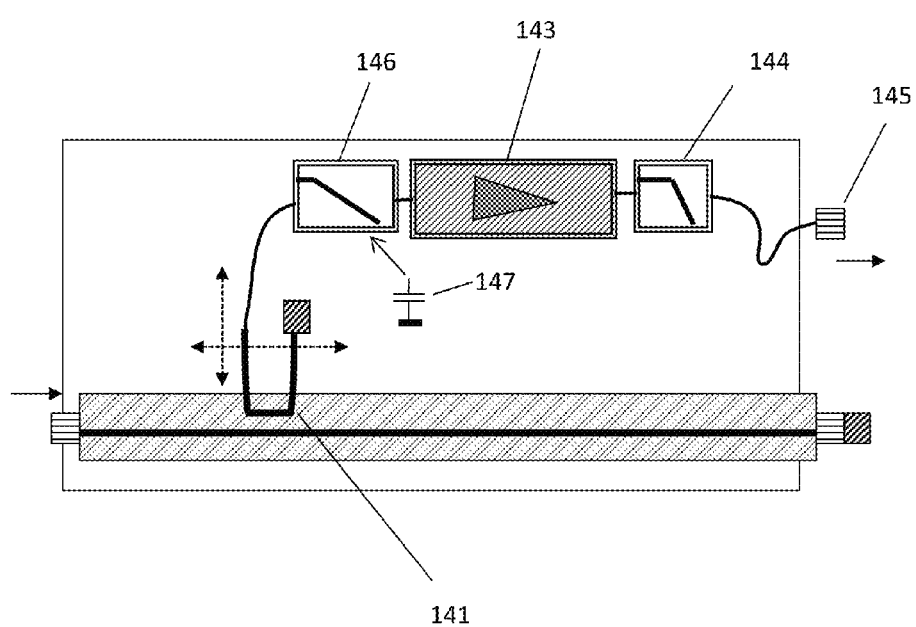

FIG. 14 depicts APC with coupling loss compensating amplifier, harmonic rejection output low pass filter and frequency slope input equalizer.

DETAILED DESCRIPTION OF THE INVENTION

The attenuation and phase controller (APC) takes advantage of the wideband and easily adjustable properties of the compact signal coupler of FIG. 5, also called "wave-probe". The compactness and easy manufacturing of this device, compared with traditional directional couplers (see ref. 2), combined with the simple handling inside the slabline allows combining this technology with the existing slide screw impedance tuner technology (see ref. 9) in creating a new component, the Attenuation-Phase Controller (APC) allowing efficient, continuous and wideband control of attenuation and phase of a transmission media. All existing automation control technology of impedance tuners (ref. 9) can be implemented into this new design, including motor gear and electronic motor control, precise horizontal and vertical axis control and computer controlled remote operation. The inherent large bandwidth and simple coupling adjustability of the wave-probe solves critical bandwidth and spurious problems of prior designs (see ref. 10).

The wave-probe (FIG. 5) is a basic electro-magnetic loop, made as the folded exposed section (4) of part of the center conductor (7, 8) of a semi-rigid RF coaxial cable (2, 3). It has wideband coupling (251) and isolation (252) behavior (FIGS. 6 and 10) sufficient for the application. The difference between coupled and isolated signal (Directivity) varies from 15 to 20 dB. Port #4 (283) is always terminated with Zo (50Ω). By approaching the loop (4) to the center conductor (1) of the slabline (5, 6) one increases the coupling factor (see FIG. 11). The wideband frequency response remains intact. This is a major advantage because it offers predictable response at the fundamental or even the harmonic frequencies. By moving the wave-probe loop (703), in FIG. 7, closer or further away from the input port (70) changes the transmission phase of the signal path from the input port (70), through the wave-probe coupler (703) to the output port (78). Because of the horizontal wave-probe loop movement (73) the RF cable (79) must be flexible and must allow full expansion and contraction. The port (77) of the slabline, opposite to the input port (70) is terminated with the characteristic impedance (76), in order to eliminate reflected waves towards the input port, which would interfere with the signal coupled into the wave-probe.

In more detail the APC is shown in FIG. 9. The unit is mounted in a housing (93) in which the slabline (95) traverses from the input port (90) to the auxiliary port (900). The auxiliary port (900) of the slabline (95) and the isolated port of the wave-probe (91) are terminated using matched 50Ω loads (901, 903). The lead screw (94) controls the horizontal position (99) of the carriage (904). The lead screw is rotated by a stepper motor (902). The carriage (904) comprises a precision vertical axis ((904), which is controlled by another stepper motor (98). Both motors are controlled via electronic control boards and external PC, as shown in FIG. 12.

The vertical axis (904) holds the body of the wave-probe (91). It can move it vertically closer of further away from the center conductor (92). By changing the distance to the center conductor changes the coupling factor (as shown in FIG. 11). This means the amount of signal power transferred from the input port (90) to the output port (96) can be adjusted. This corresponds to the adjustable attenuation. The coupled port of the wave-probe is connected to the output port (96) using flexible coaxial RF cable (97). This cable must allow the carriage (904) to move along enough distance on the slabline (95) to cover the required angle of the transmission phase. If a full circle is required this distance must be one wavelength $\lambda$. The wavelength $\lambda$ in air is equal: $\lambda$ [cm]=30/ Frequency [GHz]. i.e. for 1 GHz we need 30 cm horizontal travel and for 10 GHz we need 3 cm. The transmission phase is linearly proportional to the distance (X) of the wave-probe from the input port: $\Phi$ (rad)=2*$\pi$*X/$\lambda$. The change in phase $\delta\Phi$=2*$\pi$*$\delta$X/$\lambda$ can be accurately controlled by horizontal movement of the carriage. The phase of the section between wave-probe and output port remains constant.

The APC is calibrated using a test setup as in FIG. 12, and then used in automated test setups to adjust the instant phase of the transmission factor between ports (90) and (96). Calibration occurs using a pre-calibrated VNA, which is connected using RF cables to the input (120) and output (124) ports of the APC. Again the idle port of the slabline is terminated with Zo (123). The APC is controlled by the PC Controller using digital cable and electronic board (122), which allows horizontal (X) and vertical (Y) control of the wave-probe mounted in the carriage (121). If used in a complete test setup as in FIG. 2, then additional calibration steps must be carried out to characterize the adjacent components used in cascade with the APC, such as test fixtures and bias tees. FIG. 8 show measured transmission vector data of an APC. Every point |S21| and $\varphi$21 is measured on the VNA and shown on the polar display corresponding to a horizontal (X) and vertical (Y) position of the wave-probe. Hereby the input port (90) is designated as port 1 and the output port (96) as port 2. The data are saved in a calibration file and by proper motor control the states can be reinstated and every point in between can be interpolated within the resolution of the driving gear and stepper motors.

As can be seen in FIG. 10, the coupling factor depends on frequency. At frequencies below 5 GHz coupling is around −20 dB (0.1 linear in voltage or 0.01 in power) and increases over 10 dB up to 20 GHz. The APC will perform better if (a) this insertion loss is compensated and (b) this frequency slope is equalized. FIG. 13 shows an embodiment, whereby an amplifier (133) boosts the signal arriving at its input (132) coming through the coupler (131) from the input port (130), before it is extracted (134) and injected into the output port (135). Power amplifiers, when driven hard, compress and create harmonics. This may falsify the outcoming signal. For this a low pass filter (144) can be inserted at the output of the amplifier (143), FIG. 14. This way the signal at port (145) is clean of distortion. In order to compensate for the frequency slope an additional equalizing low pass filter structure, albeit one with a smooth slope (146) can be inserted after the coupler (141) and in front of the amplifier (143); as such, a simple grounded parallel capacitor (147) can be used.

This application discloses the concept of an integrated wideband variable attenuator and linear phase shifter for microwave frequencies, either in manual or automated form. Obvious alternatives shall not impede on the originality of the concept.

What I claim is:

1. A remotely adjustable RF attenuation and transmission phase controller (APC) comprising an input and an output port and transmission media between the ports;
   and a wideband adjustable signal coupler (wave-probe) inserted between the ports;
   said wave-probe having a coupled port and an isolated port,
   whereby part of the signal entering the input port is injected into the coupled port of the wave-probe,
   and is extracted from the output port,
   and whereby the adjustable coupling factor of the wave-probe controls the attenuation and the distance of the wave-probe from the input port controls the phase of the APC.

2. The APC as in claim 1, whereby a section of the transmission media is a slotted airline (slabline) comprising two ports, an input port and an idle port, two sidewalls and a center conductor;
   whereby the idle port is terminated with characteristic impedance (Zo),
   and whereby the remaining section of the transmission media comprises the wave-probe and flexible RF cable leading from the coupled port to the output port
   and whereby the isolated port of the wave-probe is terminated with characteristic impedance (Zo).

3. The APC, as in claim 2, comprising a mobile carriage sliding horizontally along the slabline, said carriage comprising a vertical axis.

4. The APC as in claim 3, whereby the wave-probe is attached to the vertical axis and can be inserted into the slot of the slabline.

5. The APC as in claim 4, whereby the vertical axis is remotely controlled allowing adjustment of the coupling factor between the center conductor of the slabline and the wave-probe.

6. The APC as in claim 5, whereby the position of the carriage along the slabline is remotely controlled.

7. The APC as in claim 2 or 6, whereby Zo is 50 Ohms.

8. The APC as in claim 7, whereby an amplifier having an input port and an output port is inserted in the transmission media between the coupled port of the wave-probe and the output port of the APC, whereby the coupled port of the wave-probe is connected to the amplifier input port and the amplifier output port is connected to the output port of the APC.

9. The APC as in claim 8, whereby a low pass filter is inserted between the output port of the amplifier and the output port of the APC.

10. The APC as in claim 9, whereby an equalizing network (low pass filter) is inserted between the coupled port of the wave-probe and the input port of the amplifier.

11. The APC as in claim 8, whereby an equalizing network (low pass filter) is inserted between the coupled port of the wave-probe and the input port of the amplifier.

12. A calibration method for APC as in claim 7, wherein the APC is connected to a pre-calibrated vector network analyzer (VNA) using RF cables and to a control computer using digital cables;
   and scattering (s-) parameters are measured by the VNA between the input port and the output port of the APC for various vertical positions (Y) of the wave-probe and distances (X) between the wave-probe and the input port, the positions being controlled by the computer, which is in operative communication with the VNA;
   and whereby the s-parameters are retrieved by the computer and saved in calibration files for later use.

\* \* \* \* \*